United States Patent [19]
Hien et al.

[11] Patent Number: 6,063,543
[45] Date of Patent: May 16, 2000

[54] RADIATION-SENSITIVE MIXTURE AND ITS USE

[75] Inventors: Stefan Hien, Erlangen; Michael Sebald, Weisendorf, both of Germany

[73] Assignee: Siemens Aktiengesellschaft, Munich, Germany

[21] Appl. No.: 09/299,364

[22] Filed: Apr. 26, 1999

[30] Foreign Application Priority Data

Apr. 24, 1998 [DE] Germany .................. 198 18 447

[51] Int. Cl.$^7$ .................. G03F 7/038; G03F 7/033
[52] U.S. Cl. .................. 430/270.1; 430/325; 430/326; 430/330
[58] Field of Search .................. 430/270.1, 325, 430/326, 330

[56] References Cited

U.S. PATENT DOCUMENTS

| | | | |
|---|---|---|---|
| 4,491,628 | 1/1985 | Ito et al. .................. | 430/176 |
| 5,234,794 | 8/1993 | Sebald et al. .................. | 430/325 |
| 5,346,803 | 9/1994 | Crivello et al. .................. | 430/270 |
| 5,856,071 | 1/1999 | Kotachi et al. .................. | 430/326 |

FOREIGN PATENT DOCUMENTS

| | | |
|---|---|---|
| 0 388 484 A1 | 9/1990 | European Pat. Off. . |
| 0 394 740 A2 | 10/1990 | European Pat. Off. . |
| 0 395 917 A2 | 11/1990 | European Pat. Off. . |
| 0 492 253 A1 | 7/1992 | European Pat. Off. . |
| 0 492 256 A1 | 7/1992 | European Pat. Off. . |
| 0 494 383 A1 | 7/1992 | European Pat. Off. . |
| 2332679 | 6/1999 | United Kingdom . |

OTHER PUBLICATIONS

Alexander M. Vekselman et al.: "Completely Water–Processable and Other Chemically Amplified Resists From Maleic Anhydride Copolymers", in SPIE vol. 2724, pp. 296–307.

*Primary Examiner*—Janet Baxter
*Assistant Examiner*—Rosemary Ashton
*Attorney, Agent, or Firm*—Herbert L. Lerner; Laurence A. Greenberg; Werner H. Stemer

[57] ABSTRACT

A radiation-sensitive mixture contains the following components:
a film-forming polymer which has an acid-labile, hydrolysis-stable polymer unit and at least one thermally stable polymer unit;
a radiation-sensitive compound which liberates an acid on exposure to radiation;
a solvent;
if required, additives.

This radiation-sensitive mixture can be used for the production of positive or negative relief structures, in each case with an aqueous developer.

The acid-labile polymer unit is a 1,2-dicarboxylic acid monoester and the theramally stable polymer unit is at least structure:

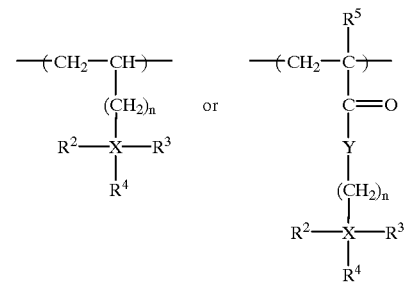

X = Si or Sn
Y = O or NH x = Si or Sn
y = O or NH

20 Claims, No Drawings

RADIATION-SENSITIVE MIXTURE AND ITS USE

BACKGROUND OF THE INVENTION

Field of the Invention

The invention relates to a radiation-sensitive mixture and the use of this radiation-sensitive mixture.

In the structuring of semiconductor components on an industrial scale, photosensitive mixtures comprising a base polymer and a photoactive (radiation-sensitive) component, so-called photoresists, are used. First, a layer of the photoresist is produced on the substrate to be structured and the image of a mask is projected into this layer by means of a suitable exposure unit. A latent image is formed by photochemical modification of the photoactive component in the layer. Depending on the tonality of the photoresist system (positive or negative), the exposed or the unexposed parts of the latent image are then dissolved away (developed) by means of a suitable developer, if necessary after a heating step. The relief structures thus obtained in the photoresist layer show the positive or negative image of the mask and in turn serve as an etch-resistant mask for structuring the substrate by means of suitable etching medium. An important precondition for photoresists having good structuring properties is, inter alia, high transparency of the base polymer at the exposure wavelength, as described in European Patent Application EP 0 388 484 A1, for example for polymers containing anhydride groups in a positive photoresist.

Proc. SPIE Vol. 2724 (1996), pages 296 to 307, describes a base polymer having 1,2-dicarboxylic acid monoester units for use in negative photoresists processible in an aqueous medium. A layer consisting of the polymer and a photosensitive acid, i.e. a compound which liberates a strong acid on exposure to light, is subjected to a heating step after structuring exposure, anhydride groups being formed under acid catalysis in the exposed parts. During the aqueous development, the unexposed parts are then selectively dissolved. The production of positive structures is however not possible with polymers of said type since the ester radicals used cannot be converted into free 1,2-dicarboxylic acid units under acid catalysis.

Owing to the unevenness and high reflectivity of semiconductor substrates, the two-layer technique is used in fine structuring. First, a planarizing and absorbing polymer layer which serves as a substrate for a thin photoresist layer (top resist) is produced on the substrate. This photoresist layer can be exposed under ideal exposure conditions (planar and light-absorbing substrate, thin layer within the depth of focus ensures crisp image). After the development, positive or negative structures with high resolution are obtained in the top resist. These structures are silylated in a separate wet-chemical step, as described in European Patent Application EP 0 395 917 A2, i.e. silicon is chemically bonded to the base polymer by means of a silicon-containing reagent; at the same time, the structures experience an adjustable lateral expansion. This ensures that the top resist structures can be transferred in an anisotropic oxygen plasma to the planarizing polymer layer, and structures having a high aspect ratio and very high resolution are obtained. An important precondition for the silylatable top resist is the use of a base polymer having reactive groups, as described in European Patent Application EP 0 388 484 A1, for example for polymers containing anhydride groups.

The so-called TSI technique (top surface imaging) has the same benefits as the two-layer technique but additionally has the advantage of a simplified process. First, a photosensitive photoresist layer is applied to the semiconductor substrate. During the structuring exposure, a latent image is then produced only in the top surface. This image is silylated, directly after exposure, in the exposed (negative) or unexposed (positive) parts, depending on tonality, as described, for example, in European Patent Application EP 0 394 740 A2 and European Patent Application EP 0 492 256 A1.

The actual development is carried out in an anisotropic oxygen plasma, structures having a high aspect ratio and very high resolution being obtained. An important precondition for a silylatable photoresist is the use of a base polymer having reactive groups, as described in European Patent Application EP 0 388 484 A1, for example for polymers containing anhydride groups.

In the case of the so-called chemically amplified photoresists (cf. for example U.S. Pat. No. 4,491,628), a small amount of an acid is produced photochemically in the photoresist layer from an ionic or nonionic photoactive acid generator by means of a small exposure dose. In a post-exposure bake (PEB), this acid effects the catalytic elimination of a protective group on the polymer and hence the change from hydrophobic to hydrophilic which is necessary for the development. By development in an alkaline developer, the exposed hydrophilic parts are dissolved and a positive image of the mask is obtained, whereas, with the use of an organic solvent as developer, the unexposed hydrophobic parts are dissolved and a negative image is obtained. In particular, tert-butoxycarbonylmaleimido groups (European Patent Application EP 0 492 253 A1), tert-butyl ester groups (European Patent Application EP 0 494 383 A1) and tert-butoxycarbonyloxystyrene groups (U.S. Pat. No. 4,491,628) are used as acid-labile protective groups.

In the case of the photoresist materials known to date, i.e. radiation-sensitive mixtures, either the exposed or the unexposed parts are thus dissolved with aqueous alkaline developers. The corresponding negative image can be produced by using organic solvents. However, this option is not feasible since an expensive safety procedure is associated therewith in wafer production. Thus, two different developers (aqueous or organic) have been required to date for the dual tonality of a resist material.

SUMMARY OF THE INVENTION

It is an object of the invention to provide a radiation-sensitive mixture which—after exposure and thermal treatment—on the one hand can be developed in an aqueous medium and on the other hand gives either a negative or a positive image. Furthermore, in particular those structures should form which can be silylated and/or modified with compounds having amino functional groups in a subsequent step.

This is achieved, according to the invention, by a radiation-sensitive mixture including a film-forming polymer functionalized with 1,2-dicarboxylic acid monoester groups, comprising an acid-labile, hydrolysis-stable polymer unit (A) of structure

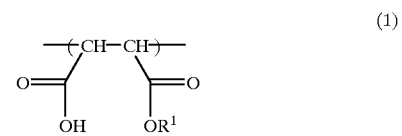

a thermally stable polymer unit (B) of structure (4)

a second thermally stable polymer unit (C) of structure (5)

(6)

and a polymer unit (D) bearing reactive groups and having a structure (7)

(8a)

(8b)

(8c)

(9)

in which the amount of (A) is from 1 to 99 mol %, the amount of (B) is from 1 to 99 mol %, the amount of (C) is from 0 to 50 mol %, and the amount of (D) is from 0 to 50 mol %, provided that the amounts of (A), (B), (C), and (D) total 100 mol %; and in which n=0, 1, 2 or 3, $R^1$ is a hydrocarbon radical bonded via a tertiary C atom to the O atom and having a total of 4 to 10 C atoms, or a 2-tetrahydrofuranyl or 2-tetrahydropyranyl radical;

$R^2$, $R^3$ and $R^4$—independently of one another—are $C_1$- to $C_6$- alkyl or $C_1$- to $C_6$- alkoxy, $C_6$- to $C_{18}$- aryl or $C_6$- to $C_{18}$- aryloxy or aralkyl having a $C_6$- to $C_{18}$- aryl group and a $C_1$- to $C_4$- alkylene radical, $R^5$ is H or $C_1$- to $C_6$ alkyl, $R^6$, $R^7$, $R^8$ and $R^9$—independently of one another—are H, $C_1$- to $C_6$- alkyl, $C_6$- to $C_{18}$- aryl, halogen, CN, methoxyphenyl or a radical of structure where $R^{15}$ is H, $C_1$- to $C_6$- alkyl, $C_6$- to $C_{18}$- aryl, $CH_2=CH-$ (vinyl), $CH_2=CH-CH_2-$ (allyl), or $CH_2=CH-CO-$;

$R^{10}$ is H, $C_1$- to $C_6$- alkyl, $C_2$- to $C_6$- alkenyl, $C_6$- to $C_{18}$- aryl, halogen or halogen-substituted $C_1$- to $C_6$- alkyl;

$R^{11}$ and $R^{12}$—independently of one another—are linear $C_1$- to $C_{18}$- alkyl;

$R^{13}$ and $R^{14}$—independently of one another—are linear $C_1$- to $C_{18}$- alkyl or tert-butyl;

X is Si or Sn, and

Y is O or NH;

a radiation-sensitive compound liberating an acid upon irradiation, and a solvent.

Additives can be included in the radiation sensitive mixture to enhance the performance.

The radiation-sensitive mixture according to the invention, i.e. the photoresist, comprises a solution of at least one base polymer having acid-labile groups, at least one photoactive compound and, if required, further additives, in a conventional photoresist solvent, such as cyclohexanone, ethyl lactate or propylene glycol monomethyl ether acetate. The special feature of the acid-labile groups is that they are 1,2-dicarboxylic acid monoester units. These groups guarantee high adhesion to the substrate and permit the production of positive and negative photoresist structures.

It was in fact surprisingly found that either negative or positive images can be produced (dual tonality) with the photoresist according to the invention—depending on the type of thermal treatment (heating), according to which starting from a material having medium solubility (medium polarity) either a hydrophobic or a hydrophilic resist layer are obtained, as desired. This is made possible by the use of photoresists comprising acid-labile polymers which have 1,2-dicarboxylic acid monoester groups.

Depending on the process, the dicarboxylic acid monoester group, which is in particular a mono-tert-butyl succinate group, is converted into either a dicarboxylic acid group or a dicarboxylic anhydride group, i.e. a succinic acid structure or succinic anhydride structure. Both processes can be carried out under acid catalysis. In this case, the thermal activation barrier is substantially reduced.

The dicarboxylic acid-modified polymers are very readily soluble in basic aqueous developers, whereas the anhydride function have a dissolution-inhibiting action—in comparison with the starting material. This can be explained chemically as follows: the elimination of the radicals $R^1$, for example in the form of isobutene, leads to the dicarboxylic acid structural unit. This is associated with the imparting of a substantial hydrophilic character, which results in a positive image in the development with (basic) aqueous solvents. The cyclization to give the anhydride structure with elimination of water leads to a reversal of the polarity of the resist material. In this way, negative structures can be produced with aqueous alkaline developers. By a further heating step at high temperatures, if necessary also in combination with flood exposure, the amount of the anhydride functions in the resist can be increased and further functionalization, for example with compounds having amino functional groups, can thus be achieved.

The processing of the photoresist requires only the equipment present in a conventional process line. The coating of the substrate with the photoresist is effected by spin-coating and subsequent drying at a temperature of 100 to 180° C., typically from 120 to 160° C., in the course of from 30 to 240 s on a hotplate. In this drying step, temperature and time are as a rule chosen so that the base polymer does not change in its composition. However, a thermal decomposition of the material can be provided for as early as this process step. A desired anhydride content is thus established in the hydrolysis-stable 1,2-dicarboxylic acid monoester precursor.

After drying, exposure is carried out, in particular in the deep UV, for example 248 nm, but if required also at 193 nm, or by means of electron beams. Thermal treatment (PEB) decisive for the tonality of the image is then carried out. The chosen PEB temperature and the duration determine whether positive or negative images are obtained with aqueous basic developers. At low temperatures, i.e. <140° C., and with short times, positive images are obtained since the generation of the additional free carboxyl groups on the polymer results in an increase in solubility. At high PEB temperatures, i.e. >140° C., and with long reaction times, negative images are produced. This results from the formation of additional anhydride functions. In the case of negative images, longer development times are required compared with positive images, with the same developer concentration.

The photoresist according to the invention preferably has an ionic or nonionic compound generating an acid upon irradiation as a radiation-sensitive compound. The ionic compound is advantageously an onium salt, in particular an iodonium or sulfonium salt, preferably having a sulfonate anion, such as triphenylsulfonium triflate and diphenyliodonium p-toluenesulfonate (see J. V. Crivello, "Advances in Polymer Science", Vol. 62, Springer Verlag Berlin, 1982, pages 1–48). The nonionic compound is advantageously an imidosulfonic acid ester or phenolsulfonic acid ester (see "Chem. Mater." 1995 (7) pages 1315–1324) or nitrobenzylsulfonic acid ester (see "J. Imaging Sci. Technol." 1997 (41) pages 35–40), but, for example, pyrogallol derivatives may also be used.

The additives which, if required, are added to the radiation-sensitive mixture according to the invention may be, for example, dyes, flow improvers, acid acceptors, i.e. basic compounds, or stabilizers.

Polymers of the above-mentioned type form the subject of the simultaneously submitted German Patent Application No. 198 18 446.8 and corresponding U.S. Patent Application Docket No. GR 98 P 3292—"Film-forming polymers". The amounts of the polymer units (A) and (B) sum to 100 mol % when only such polymer units are present. When polymer units (C) and/or (D) are present in amounts greater than 0 mol %, the amounts of polymer units (A), (B), (C) and/or (D) sum to 100 mol %. By suitable choice of amounts of these polymer units and the corresponding ratios of the unsaturated monomer source of these polymer units, the polymer properties, such as glass transition temperature and solubility, can be controlled.

The amount of polymer unit (A) of the polymer is preferably from 5 to 50 mol %. The amount of polymer units (C) and/or (D) when present is in the range from 1 to 50 mol %, preferably from 5 to 15 mol % and 1 to 10 mol %, respectively.

As a feature of this invention, the hydrolytically stable and acid labile polymer units (A) are resistant to exposure to water and acidic solutions up to 70° C. As a further feature of this invention, the thermally stable polymer units (B) and (C) resist depolymerization and degradation of the polymer chain up to 230° C. under thermal conditions and the polymer units (A) decompose thermally above 150° C. and at 135° C. or more under acid-catalyzed conditions, while the film forming polymers of the invention can be selectively converted to either positive or negative photoresist by controlled heat treatment at a suitable temperature followed by development in an aqueous alkaline solution.

DESCRIPTION OF THE PREFERRED EMBODIMENTS

In the polymer of this invention, the radical $R^1$ may be, for example, a tert-butyl radical —$C(CH_3)_3$, a tert-pentyl radical —$C(CH_3)_2$—$C_2H_5$ or a 1-adamantyl radical (—$C_{10}H_{15}$). An important feature of the polymer unit (B) is its metallic component, i.e. the presence of silicon Si or tin Sn.

The polymer according to the invention can have 1,2-dicarboxylic acid monoester groups as in the structural units (1), (2), or (3), on the chain or as pendant groups. A polymer comprising units (A) and (B) having groups on the chain can be prepared, for example, by reacting a maleic anhydride copolymer with tert-butanol. The mono-tert-butyl 1,2-dicarboxylate groups can also be introduced into the polymer by homo- or copolymerization of mono-tert-butyl fumarate or maleate.

Polymers having pendant 1,2-dicarboxylic acid monoester groups, i.e. having groups which are not bonded directly to the polymer main chain but are situated outside the main chain, can be obtained, for example, by homopolymerization of or copolymerization with 1-alkyl-2-(3-alkylenesuccinic anhydride)-ethylene and subsequent reaction with tert-butanol or by homopolymerization of 1-alkyl-2-(mono-tert-butyl 3-alkylenesuccinate)ethylene. In the case of the structural unit (3), the 1,2-dicarboxylic acid monoester groups are bonded via a norbornyl radical to the polymer main chain.

The polymers according to the invention have weight average molecular weight in the range from 5,000 to 15,000, typically approximately 12,000, and glass transition temperatures in the ange from 110 to 150° C., typically 130° C. The characteristic vibrational bands in the infra-red spectrum of the monoester moieties (polymer unit A) are at 1730 and 1710 cm$^{-1}$. Tert-butyl succinate monoester moieties also have a characteristic band at 1150 cm$^{-1}$. Bands characteristic of anhydride groups are found at 1750 and 1780 cm$^{-1}$.

For the preparation of polymers according to the invention, in general an unsaturated monomer source for the polymer units (A) is copolymerized with an electron-rich monomer source for the polymer units (B). The monomer source for polymer units (A) of structure (1) is a monoester of maleic acid or fumaric acid in which the esterifying group $R^1$ is as defined above. The monomer source for polymer unit (A) of structure (2) can be a monoester of alkylidenesuccinic acid, alkylmaleic acid or alkylfumaric acid in which the esterifying group $R^1$ is as defined above. The monomer source for polymer unit (A) of structure (3) can be a norbornenedicarboxylic acid monoester in which the esterifying group $R^1$ is as defined above. The monomer source for polymer unit (B) is an unsaturated compound with high electron density at the double bond, such as an allyl compound (leading to structure (4)) or an acrylic ester or amide (leading to structure (5)). As a result of this copolymerization, on the one hand high polymer yields are achieved and on the other hand physical properties of the polymers can be controlled. Thus, for example, a specific Si content can be realized.

In addition to polymer units (A) and (B), the polymers according to the invention advantageously can include a further thermally stable polymer unit (C) as defined above and also a further polymer unit (D) as defined above.

The polymer unit (D) has reactive groups which permit modification by an after treatment of the polymer. For this purpose, (D) contains either an imido group (structural unit 7) or an anhydride or lactone group (structural unit 8) or a dialkyl dicarboxylate group (structural unit 9). The anhydride group is based on succinic anhydride (structural unit 8a) or glutaric anhydride (structural unit 8b) and the lactone group is based on γ-butyrolactone (structural unit 8c). An R substituent in polymer unit (D) can be, for example, an ethyl group.

Modifying agents advantageously used in reaction with polymer units (D) for effective after treatment include amines such as bis(aminoalkyl)oligodimethylsiloxane.

A photoresist according to the invention, having high sensitivity in deep UV, in particular 248 nm, can be obtained, for example, by dissolving a copolymer comprising 50 mol % of mono-tert-butyl 1,2-dicarboxylate groups and 50 mol % of allyltrimethylsilane groups together with triphenylsulfonium trifluoromethanesulfonate (as a photoactive acid generator) in cyclohexanone.

Other features which are considered as characteristic for the invention are set forth in the appended claims.

Although the invention is illustrated and described herein as embodied in a radiation-sensitive mixture and its use, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific examples.

The invention is to be illustrated in more detail with reference to embodiments (pbw=parts by weight).

EXAMPLE 1

Preparation of a polymer having mono-tert-butyl 1,2-dicarboxylate groups 250 pbw of a 10% by weight solution of potassium tert-butylate in dry tetrahydrofuran are added to a solution of 50 pbw of an alternating copolymer of maleic anhydride and styrene in 50 pbw of dry tetrahydrofuran at room temperature with thorough stirring. The reaction mixture is then heated to 50° C. for 30 min and then cooled to room temperature. 25 pbw of glacial acetic acid are added to the gel formed. The clear solution obtained is added dropwise to 1000 pbw of water while stirring, the precipitate is filtered off and the colorless polymer powder is then dried at 50° C. for 24 hours in vacuo.

EXAMPLE 2

Preparation of a polymer having mono-tert-butyl 1,2-dicarboxylate groups 8 pbw of tert-butyl fumarate (preparation analogous to J. Heterocyclic Chem. Vol. 32 (1995), pages 1309 to 1315) are dissolved together with 5.7 pbw of allyltrimethylsilane and 0.08 pbw of azobisisobutyronitrile in 15 pbw of ethyl acetate. The solution is heated to the boil for 24 hours and then cooled to room temperature. 10 pbw of colorless polymer powder are obtained by dropwise addition of the polymer solution to petroleum ether (boiling range from 60 to 80° C.), subsequent filtration and drying at 50° C. for 24 hours in vacuo.

EXAMPLE 3

Preparation of a highly sensitive photoresist for exposure in deep UV 7 pbw of the polymer prepared according to Example 2 are dissolved with 1 pbw of triphenylsulfonium trifluoromethanesulfonate in 92 pbw of cyclohexanone. The solution obtained is then filtered over a 0.2 μm micro filter. A ready-to-use solution of photoresist for exposure in deep UV, for example at 248 or 193 nm, is obtained.

EXAMPLE 4

Preparation of a photoresist containing anhydride groups from a hydrolysis-stable precursor A 1 μm thick light-absorbing layer is obtained by applying a solution of 25 pbw of novolak (phenol-formaldehyde resin) in 75 pbw of propylene glycol monomethyl ether acetate by spin-coating at 3500 min$^{-1}$ and subsequent heating at 230° C./30 min in a forced-circulation oven. A 0.3 μm thick photosensitive photoresist layer having anhydride groups is applied to this layer by applying the photoresist solution prepared according to Example 3 by spin-coating at 4500 min$^{-1}$ and drying at 180° C./120 s on a hotplate.

EXAMPLE 5

Preparation of positive photoresist structures containing anhydride groups (two-layer technique)

A 1 μm thick light-absorbing layer is obtained by applying a solution of 25 pbw of novolak in 75 pbw of propylene glycol monomethyl ether acetate by spin-coating at 3500 min$^{-1}$ and subsequent heating at 230° C./30 min in a forced-circulation oven. A 0.3 μm thick photosensitive photoresist layer is applied to this layer by applying the photoresist solution prepared according to Example 3 by spin-coating at 4500 min$^{-1}$ and drying at 100° C./60 s on a hotplate. The image of a mask which contains line/space structures with a pitch of 0.5 μm is then projected onto this layer by means of a 248 nm projection exposure unit with a dose of 20 mJ/cm$^2$. Heating on the hotplate at 130° C./60 s is then carried out. The layer is then developed with a 0.01 N tetramethylammonium hydroxide developer for 60 s by the puddle method and then heated at 190° C./120 s on a hotplate (anhydride formation). 0.3 μm high line/space structures with a pitch of 0.5 μm are obtained.

EXAMPLE 6

Production of negative photoresist structures containing anhydride groups (two-layer technique)

A 1 μm thick light-absorbing layer is obtained by applying a solution of 25 pbw of novolak in 75 pbw of propylene glycol monomethyl ether acetate by spin-coating at 3500 min$^{-1}$ and subsequent heating at 230° C./30 min in a forced-circulation oven. A 0.3 μm thick photosensitive photoresist layer is applied to this layer by applying the photoresist solution prepared according to Example 3 by spin-coating at 4500 min$^{-1}$ and drying at 100° C./60 s on a hotplate. The image of a mask which contains line/space structures with a pitch of 0.5 μm is then projected onto this layer by means of a 248 nm projection exposure unit with a dose of 20 mJ/cm$^2$. Heating on a hotplate at 170° C./60 s is then carried out (anhydride formation in the exposed area). The layer is then developed with a 0.26 N tetramethylammonium hydroxide developer for 60 s by the puddle method. 0.3 μm high line/space structures with a pitch of 0.5 μm are obtained.

EXAMPLE 7

Production of silylated structures developed under dry conditions (two-layer technique)

Photoresist structures produced according to Example 5 or 6 are silylated with a 2.5% by weight solution of bis(aminoalkyl)oligodimethylsiloxane in a mixture of 1 pbw of water and 5 pbw of isopropanol for 60 s by the puddle method and dried at 100° C./60 s on a hotplate. The silylated structures are then transferred in a plasma etching unit by means of an anisotropic oxygen plasma to the light-absorbing layer present underneath. 0.3 μm high line/space structures having steep sidewalls with a pitch of 0.5 μm are obtained.

We claim:

1. A radiation-sensitive mixture including a film-forming polymer functionalized with 1,2-dicarboxylic acid monoester groups, comprising an acid-labile, hydrolysis-stable polymer unit (A) of structure:

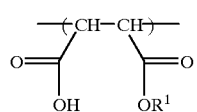
(1)

-continued

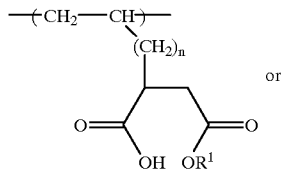
(2)

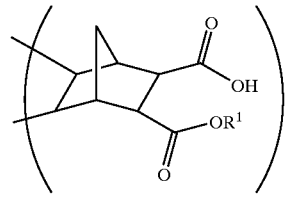
(3)

a thermally stable polymer unit (B) of structure:

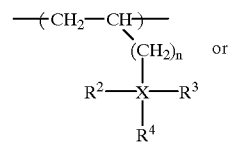
(4)

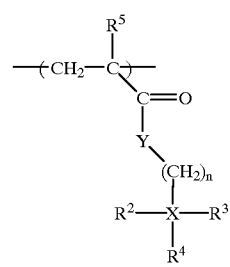
(5)

a second thermally stable polymer unit (C) of structure

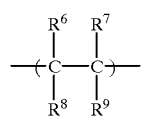
(6)

and a polymer unit (D) bearing reactive groups and having a structure

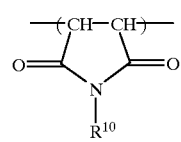
(7)

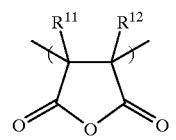
(8a)

-continued

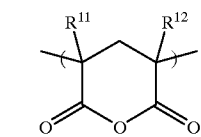
(8b)

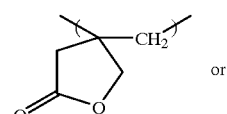
(8c)

or

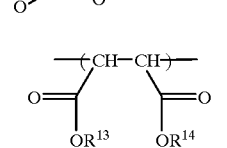
(9)

in which the amount of (A) is from 1 to 99 mol %, the amount of (B) is from 1 to 99 mol %, the amount of (C) is from 0 to 50 mol %, and the amount of (D) is from 0 to 50 mol %, provided that the amounts of (A), (B), (C), and (D) total 100 mol %; and in which n=0, 1, 2 or 3;

$R^1$ is a hydrocarbon radical bonded via a tertiary C atom to the O atom and having a total of 4 to 10 C atoms, or a 2-tetrahydrofuranyl or 2-tetrahydropyranyl radical;

$R^2$, $R^3$ and $R^4$—independently of one another—are $C_{1-}$ to $C_{6-}$ alkyl or $C_{1-}$ to $C_{6-}$ alkoxy, $C_{6-}$ to $C_{18-}$ aryl or $C_{6-}$ to $C_{18-}$ aryloxy or aralkyl having a $C_{6-}$ to $C_{18-}$ aryl group and a $C_{1-}$ to $C_{4-}$ alkylene radical;

$R^5$ is H or $C_{1-}$ to $C_{6-}$ alkyl;

$R^6$, $R^7$, $R^8$ and $R^9$—independently of one another—are H, $C_{1-}$ to $C_{6-}$ alkyl, $C_{6-}$ to $C_{18-}$ aryl, halogen, CN, methoxyphenyl or a radical of structure

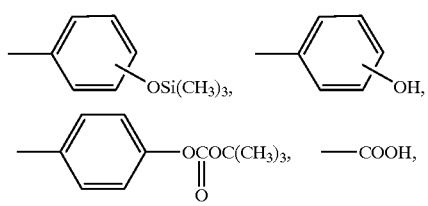

where $R^{15}$ is H, $C_{1-}$ to $C_{6-}$ alkyl, $C_{6-}$ to $C_{18-}$ aryl, $CH_2=CH—$, $CH_2=CH—CH_2—$, or $CH_2=CH—CO—$;

$R^{10}$ is H, $C_{1-}$ to $C_{6-}$ alkyl, $C_{2-}$ to $C_{6-}$ alkenyl, $C_{6-}$ to $C_{18-}$ aryl, halogen or halogen-substituted $C_{1-}$ to $C_{6-}$ alkyl;

$R^{11}$ and $R^{12}$—independently of one another—are linear $C_{1-}$ to $C_{18-}$ alkyl;

$R^{13}$ and $R^{14}$—independently of one another—are linear $C_{1-}$ to $C_{18-}$ alkyl or tert-butyl;

X is Si or Sn, and

Y is O or NH;

a radiation sensitive compound liberating an acid upon irradiation, a solvent, and optionally at least one additive.

2. The radiation-sensitive mixture according to claim 1, in which the radiation-sensitive compound which liberates an acid on exposure to radiation is an ionic compound, or a nonionic compound.

3. The radiation-sensitive mixture according to claim 2, in which the radiation sensitive compound is an onium salt or an imidosulfonic acid ester.

4. The radiation-sensitive mixture according to claim 1, in which the amount of the polymer unit (A) is from 5 to 50 mol %.

5. The radiation-sensitive mixture according to claim 1, in which the amount of the polymer unit (C) is from 1 to 50 mol %.

6. The radiation-sensitive mixture according to claim 1, in which the amount of polymer unit (D) is from 1 to 50 mol %.

7. The radiation-sensitive mixture according to claim 1, in which $R^1$ is tert-butyl or tetrahydrofuranyl.

8. The radiation-sensitive mixture according to claim 1, in which n=1.

9. The radiation-sensitive mixture according to claim 1, in which each of $R^2$, $R^3$, and $R^4$ is methyl and X is Si.

10. The radiation-sensitive mixture according to claim 1, in which each of $R^6$, $R^7$, and $R^8$ is H and $R^9$ is n-hexyl.

11. The radiation-sensitive mixture according to claim 1, in which polymer unit (D) is

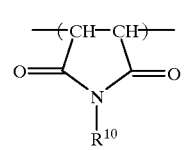
(7)

and $R^{10}$ is methyl.

12. The radiation-sensitive mixture according to claim 1, in which polymer unit (A) is

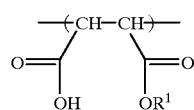
(1)

polymer unit (B) is

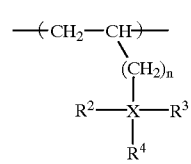
(4)

$R^1$ is tert-butyl, $R^2$, $R^3$ and $R^4$ are each methyl and X is Si.

13. The radiation-sensitive mixture according to claim 12, comprising 50 mol % of polymer unit (A) and 50 mol % of polymer unit (B).

14. The radiation-sensitive mixture according to claim 1, in which the amount of polymer unit (C) is 10 mol %, $R^6$, $R^7$, and $R^8$ are each H, and $R^9$ is n-butyl.

15. The radiation-sensitive mixture according to claim 1, in which the amount of polymer unit (C) is 10 mol %, the amount of polymer unit (D) is 5 mol %, $R^6$, $R^7$, and $R^8$ are each H, $R^9$ is n-hexyl and $R^{10}$ is methyl.

16. The radiation-sensitive mixture according to claim 1, in which the solvent is cyclohexanone, ethyl lactate, or propylene glycolmonomethylether acetate.

17. A process of preparing a modifiable dual tonality resist structure in which a radiation sensitive mixture according to claim 1 is coated on a substrate, dried, imagewise irradiated, and heat treated under such conditions of temperature and time as determine the tonality of the image resulting from development in aqueous alkaline solution.

18. The process of claim 17 in which heat treatment is carried out at maximum 140° C. and a positive image is obtained after development in aqueous alkaline solution.

19. The process of claim 17 in which heat treatment is carried out at a temperature in excess of 140° C. and a negative image is obtained after development in aqueous alkaline solution.

20. A process according to claim 17 in which the resist structure obtained is modified by reaction with bis (aminoalkyl)oligodimethylsiloxane.

* * * * *